United States Patent [19]
Kawamura

[11] Patent Number: 5,311,121
[45] Date of Patent: May 10, 1994

[54] APPARATUS FOR MEASURING THE ELECTRICAL TIME CONSTANT OF THE QUADRATURE-AXIS DAMPER OF A SYNCHRONOUS MACHINE

[75] Inventor: Mitsuhiro Kawamura, Nagasaki, Japan

[73] Assignee: Mitsubishi Denki Kabushiki Kaisha, Tokyo, Japan

[21] Appl. No.: 84,447

[22] Filed: Jul. 1, 1993

Related U.S. Application Data

[63] Continuation of Ser. No. 775,586, Oct. 15, 1991, abandoned.

[30] Foreign Application Priority Data

Apr. 12, 1991 [JP] Japan .................. 3-106506

[51] Int. Cl.⁵ .......................................... G01R 31/34
[52] U.S. Cl. .......................... 324/158 MG; 324/545
[58] Field of Search ............. 324/158 MG, 158 SY, 324/545, 543; 322/99; 318/800, 803, 490, 722; 310/68 R; 340/648

[56] References Cited

U.S. PATENT DOCUMENTS

| | | | |
|---|---|---|---|
| 3,651,402 | 3/1972 | Leffmann | 324/158 MG |
| 4,293,923 | 10/1981 | Jasmin et al. | 364/815 |
| 4,593,240 | 6/1986 | Blaschke | 324/158 MG |
| 4,739,256 | 4/1988 | Fetcher et al. | 324/158 MG |
| 4,920,306 | 4/1990 | Mard et al. | 318/722 |
| 5,202,620 | 4/1993 | Kawamura | 324/158 MG |

FOREIGN PATENT DOCUMENTS

| | | |
|---|---|---|
| 62-79380 | 4/1987 | Japan . |
| 1-217279 | 8/1989 | Japan . |
| 2-304380 | 12/1990 | Japan . |
| 1114995 | 9/1984 | U.S.S.R. ............ 324/158 MG |

OTHER PUBLICATIONS

Lohmeier; "Measurement of Motor Time Constant"; IBM Technical Disclosure Bulletin; vol. 14, No. 6; Nov. 1971.

*Primary Examiner*—Vinh Nguyen
*Attorney, Agent, or Firm*—Burns, Doane, Swecker & Mathis

[57] ABSTRACT

An apparatus for measuring the electrical time constant of the quadrature-axis damper of a synchronous machine is designed such that a voltage from a d.c. power source is applied by switching to armature windings of two phases, so that an armature current rises and thereafter maintains a constant value. A current induced on a quadrature-axis damper diminishes at a rate determined by the quadrature-axis damper time constant, and this decreasing current and the constant armature current flow inside the synchronous machine to produce a constant resistance drop by resistance of the armature windings and the armature current. In this time, the length of time length until the voltage waveform falls to a prescribed level is measured as the time constant of the quadrature-axis damper with such a measuring device as an electromagnetic oscilloscope.

20 Claims, 3 Drawing Sheets

APPARATUS FOR MEASURING THE ELECTRICAL TIME CONSTANT OF THE QUADRATURE-AXIS DAMPER OF A SYNCHRONOUS MACHINE This application is a continuation, of U.S. patent application Ser. No. 07/775,586, filed Oct. 15, 1991, now abandoned.

BACKGROUND OF THE INVENTION

1. Field of the Invention

The present invention relates to an apparatus for measuring the electrical time constant of the quadrature-axis damper of a synchronous machine among machine parameters needed for the computation in its control operation based on vector control, the measurement being implemented in the stage of the sole machine test during the assembly of the machine in the factory.

2. Description of the Prior Art

There is no test method available for directly measuring the electrical time constant of the quadrature-axis damper of a synchronous machine. For example, a publication "Procedure of Testing a Synchronous Machine, Part 1 through Part 4", published by The Institute of Electrical Engineers of Japan, does not describe any technique for directly measuring the electrical time constant of the quadrature-axis damper of a synchronous machine. A method of indirect measurement is conceivable in that the damper is regarded as a secondary conductor of an induction motor, the input power is measured in a lock test, the equivalent resistance which matches the input power is calculated and the quadrature-axis damper electrical time constant is finally obtained from the ratio of the equivalent resistance to the armature reaction inductance which is evaluated separately. However, a model of the synchronous machine used in the control computation, which is the inherent purpose, does not match with a model of the synchronous machine in the indirect measuring method based on the conversion of input power, and therefore the quadrature-axis damper electrical time constant cannot be settled.

Moreover, the damper electrical time constant needed in the control computation is the time constant in a macroscopic sense resulting from the treatment of unbalanced multi-phase windings formed of multiple conductor bars embedded in the core of magnetic poles of the synchronous machine. Accordingly, evaluating the inductance and resistance sequentially and calculating their ratio for obtaining the electrical time constant, which is the case relevant to the usual concentrated circuit parameter system, cannot be applied to the present situation.

Conventionally, synchronous machines have been used as generators and motors operated at constant revolving speeds. These machines are provided with dampers for a purpose of suppressing speed fluctuation and for the additional purpose of producing a starting torque by utilizing it as a cage rotor of induction motor. In such circumstances of dampers, it has not been necessary to know the value of the damper electrical time constant, and accordingly there has been no need to measure the damper electrical time constant directly.

Due to the conventional state of measuring methods intended for the evaluation of the quadrature-axis damper electrical time constant of a synchronous machine as described above, it has not been possible for the implementation of high-accuracy control called "vector control" to assess the damper electrical time constant as one of machine parameters used by the controller. On this account, it has been necessary to have iterative operation tests for the machine and controller in combination thereby to improve the control performance by narrowing the assessment of electrical time constant, resulting unfavorably in an excessive expenditure of time and cost for this test step.

Another problem is that the accurate evaluation of the quadrature-axis damper electrical time constant is required at the stage of testing a single machine immediately after it has been assembled in the factory, so that the optimal value of machine electrical time constant, which has great significance for the accuracy of control computation, is set to the controller in order to accomplish high-accuracy control.

SUMMARY OF THE INVENTION

The present invention is intended to overcome the foregoing prior art problems, and its prime object is to provide an apparatus for measuring the electrical time constant of the quadrature-axis damper of a synchronous machine capable of directly measuring the quadrature-axis damper electrical time constant, which is one of the machine parameters used in the control computation, at a high accuracy and in a short time in the stage of sole single machine test in the factory.

The measuring apparatus based on the present invention is designed such that a synchronous machine is placed to have its rotor maintained stationary at the position where a quadrature-axis magnetomotive force is generated by the current conduction between two armature windings of two phases, with a winding of remaining phase being opened, and the time length between the time when the current having an approximate step waveform is applied to the two windings has reached a certain value until a voltage which decreases to a value of resistance drop of the armature windings falls to a certain level is measured with a measuring means.

Other objects and features of the present invention will become apparent from the following detailed description of specific embodiments taken in conjunction with the accompanying drawings.

BRIEF DESCRIPTION THE DRAWINGS

Figure 4:
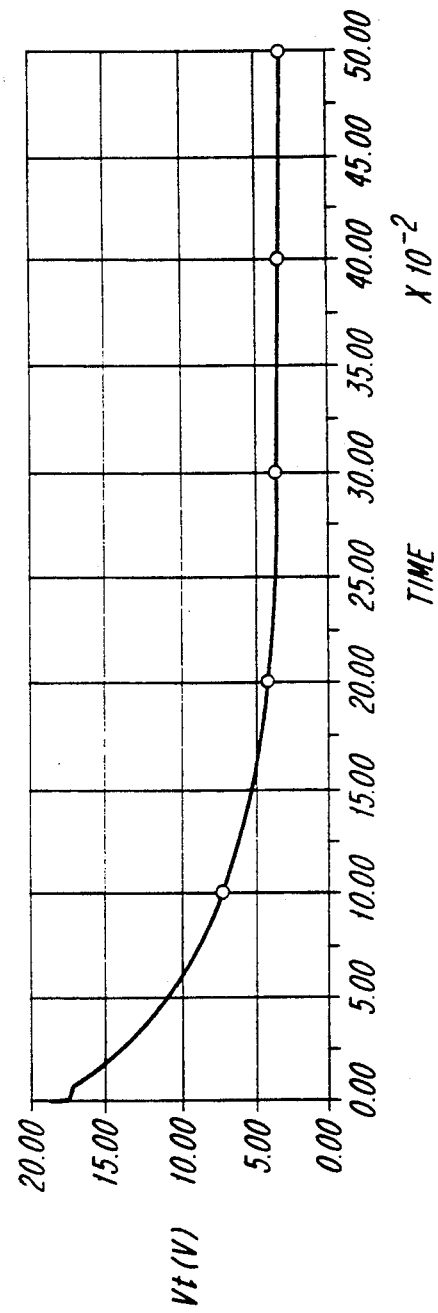
Figure 3A:
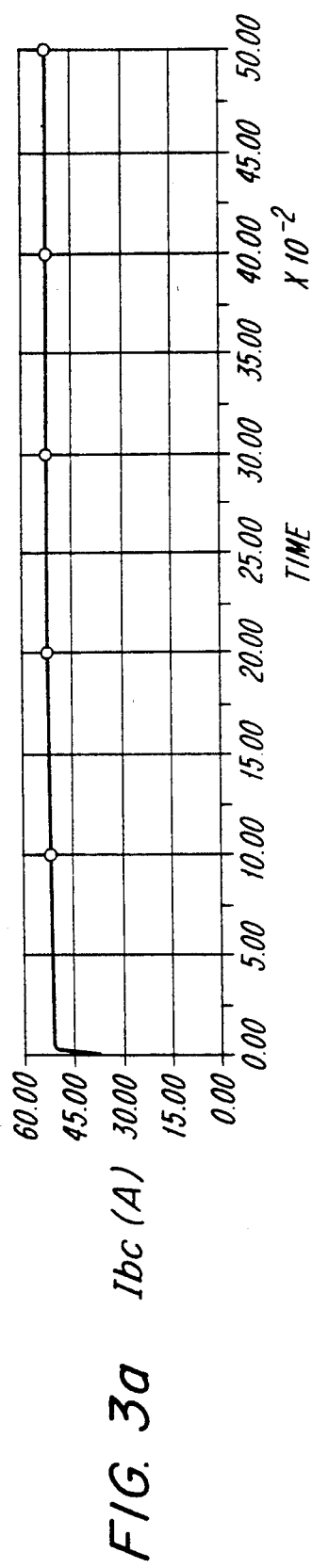
Figure 3B:
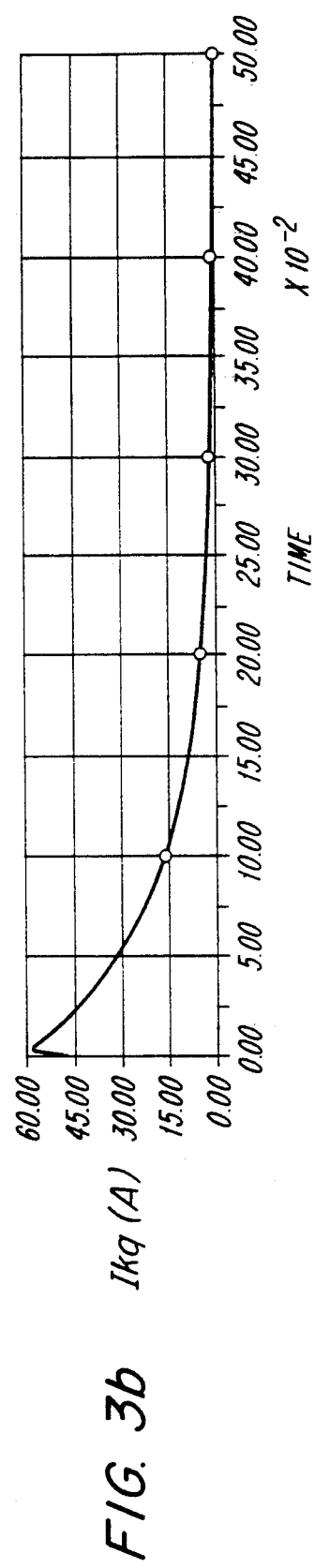
Figure 3C:
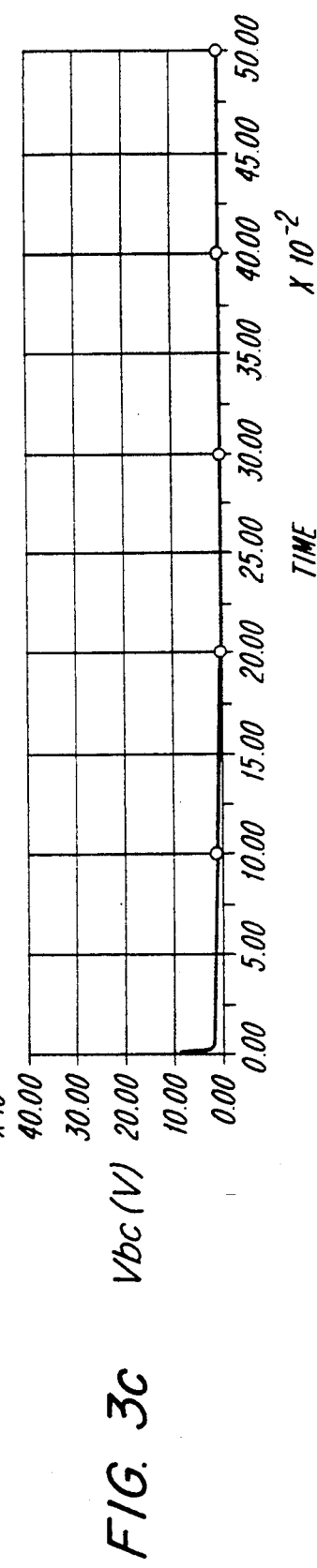
Figure 5:
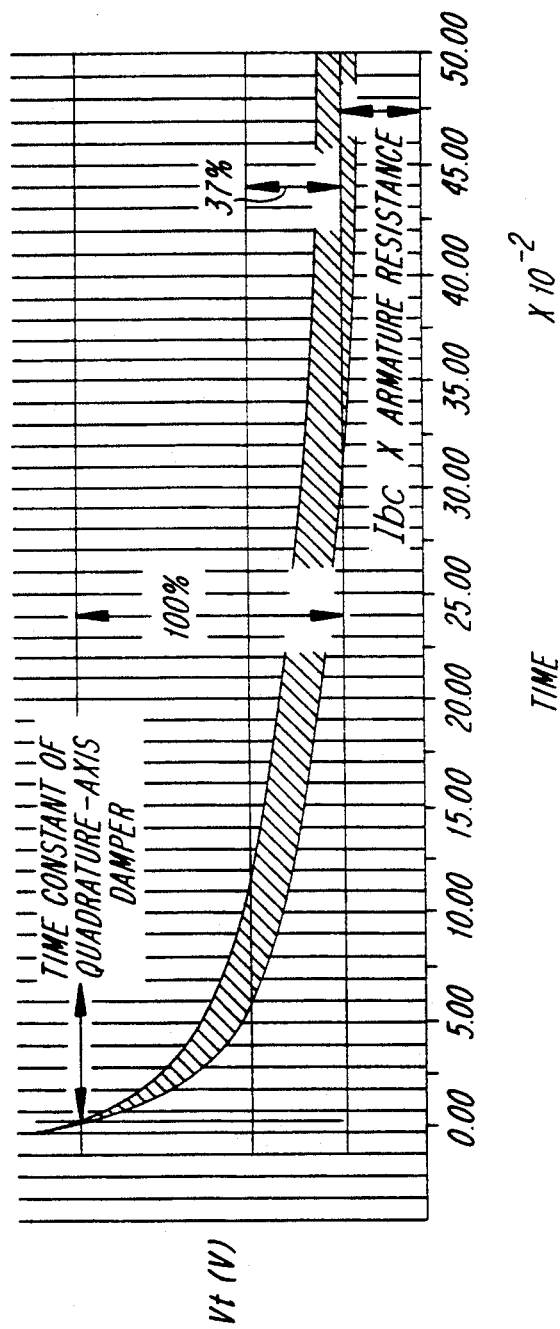
Figure 6:
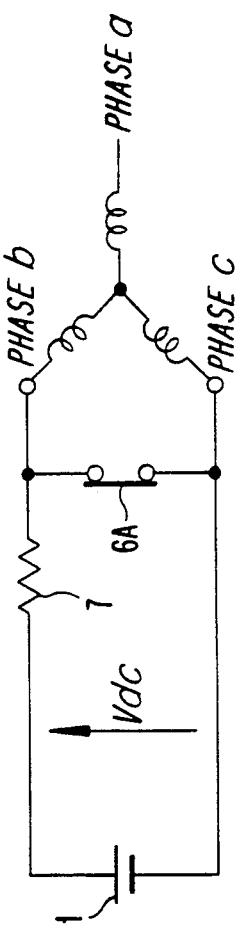

FIGS. 3(a), 3(b) and 3(c) are timing charts based on the simulation, showing the signals observed at various portions of the inventive apparatus;

FIG. 4 is a timing chart based on the simulation, showing the output voltage of the saturation circuit of the inventive apparatus;

FIG. 5 is a timing chart showing the output voltage of the saturation circuit observed on an electromagnetic oscilloscope; and FIG. 6 is a schematic diagram showing the step current waveform generation circuit based on another embodiment of this invention.

DESCRIPTION OF THE PREFERRED EMBODIMENT

Figure 1:
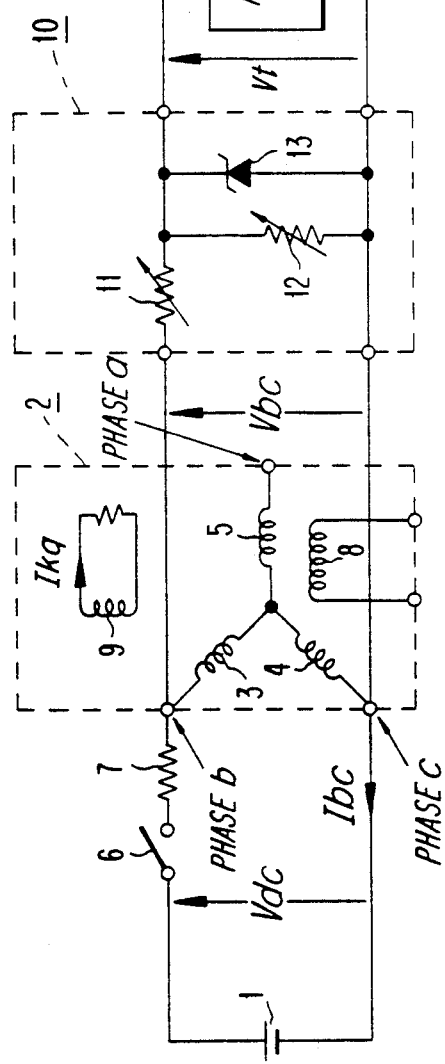
FIG. 1 is a schematic diagram showing the apparatus for measuring the electrical time constant of the quadrature-axis damper,, of a synchronous machine based on an embodiment of invention.

An embodiment of the present invention will be described with reference to the drawings. In FIG. 1, indicated by 1 is a d.c. power source such as a d.c. generator, 2 is a synchronous machine (e.g., an a.c. motor), and 3, 4 and 5 are 3-phase armature windings of the motor 2, of which the windings 3 and 4 are connected in series to the d.c. power source 1 through a switch 6 and a resistor 7, and another winding 5 is left open. Indicated by 8 is a field winding of the motor 2, 9 is a damper, 10 is a saturation circuit consisting of resistors 11 and 12 and a constant-voltage diode (Zener) diode 13, and 14 is an electromagnetic oscilloscope used as a measuring means.

Figure 2:
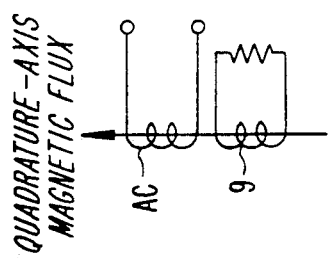
FIG. 2 is a schematic diagram showing the principle of measurement of the quadrature-axis damper electrical time constant based on this invention.

Next, the operation of the above arrangement will be explained. First, the concept of the quadrature-axis damper electrical time constant will be explained on FIG. 2. The damper 9 in a closed circuit configuration is given an initial value of quadrature-axis magnetic flux, with the armature winding AC being left open. After the initial flux application, the magnetic flux and current in the damper 9 will diminish at a rate of determined by the electrical time constant of the quadrature-axis damper. Although the model of damper shown in FIG. 2 is a single winding, it is actually made up of multiple conductor bars embedded in the core of magnetic poles. This invention is designed to evaluate the quadrature-axis damper electrical time constant through the measurement of the time constant when the magnetic flux and current in the damper diminish.

If the above-mentioned principle were to be practiced intact, the direct measurement of the quadrature-axis damper electrical time constant would be carried out as follows. Initially, the rotor is fixed at the position where the current conduction through the armature windings of phases b and c, with the a-phase winding being open, produces a quadrature-axis magnetomotive force. In this state, when a d.c. current is conducted through the armature windings 3 and 4 (phases b and c), then the damper 9 is given a quadrature-axis magnetic flux.

In the steady state, when the armature current flowing through phases b and c is cut off, part of the magnetic flux produced by the armature windings 3 and 4 which intersects the damper 9 produces an induction current on the damper, 9, and the magnetic flux and current determined by the damper diminish at a rate of the quadrature-axis damper electrical time constant. The remaining component of the magnetic flux of the armature windings 3 and 4 which does not intersect the damper, i.e., the leakage magnetic flux, produces a transitional voltage when the current is cut off, and the magnitude of this transitional voltage will be determined from such an incident as the emergence of arc. Namely, the voltage induced across the armature windings 3 and 4 cannot be foreseen by computation, and it can even destroy the insulation. On this account, a current of a step waveform is supplied to the armature based on the fact that the current cutoff phenomenon is the superimposition of a negative step current on a d.c. current.

Next, the operation will be explained in more detail on FIG. 1. Initially, the rotor is fixed at the position where the current conduction through the armature windings 3 and 4 of phases b and c produces a quadrature-axis magnetomotive force. Specifically, the armature windings of phases b and c are short-circuited, and a d.c. current is conducted to phases b and c. At the same time, a d.c. current is fed to the field winding 8. The rotor is fixed at the position of equilibrium of the magnetic forces between the stator and rotor. With the rotor being placed at this position as shown in FIG. 1, a current conduction through phases b and c causes the generation of an armature magnetomotive force.

When the switch 6 is closed and a d.c. voltage is applied between phases b and c through a resistor 7 of a sufficiently large resistance, the armature current $I_{bc}$ will rise with an approximate step waveform. In order for implementation of the test to be equivalent to the above-mentioned principle, the resistor 7 and the d.c. voltage $V_{dc}$ are desirably as large as possible without destroying the insulation so that the current waveform is close to the step function. By adjusting the values of the resistor 7 and d.c. voltage $V_{dc}$, the rising waveform of the armature current $I_{bc}$ can be modified.

The voltage induced across an armature circuit is recorded with an electromagnetic oscilloscope 14 by way of the saturation circuit 10 which consists of the resistors 11 and 12 and the Zener diode 13 shown in FIG. 1. The saturation circuit 10 works to cut a sharp component of the voltage induced in the armature circuit immediately after the switch has been closed. By conducting the voltage through the saturation circuit 10, only a component of armature induction voltage which diminishes at a moderate rate of the quadrature-axis electrical time constant is introduced to the electromagnetic oscilloscope 14.

FIGS. 3a-3c shows the result of simulation by a model of the electrical circuit shown in FIG. 1, of which FIG. 3(a) is the armature current $I_{bc}$, FIG. 3(b) is a representative value $I_{kg}$ of the current induced on the damper 9, and FIG. 3(c) is the terminal voltage $V_{bc}$ of the armature circuit The armature current $I_{bc}$ rises immediately after the switch 6 has been closed, and thereafter it keeps a constant value. The representative value $I_{kq}$ of the induction current on the damper 9 resulting from the armature current conduction also rises immediately after the switch 6 has been closed, but it begins to diminish at a moderate rate determined by the quadrature-axis damper electrical time constant after the armature current $I_{bc}$ reaches the steady state.

During the period when the representative value $I_{kq}$ induced on the damper 9 is decreasing gradually at the rate of the quadrature-axis damper electrical time constant, only the representative value $I_{kq}$ and the d.c. armature current $I_{bc}$ flow in the motor. Since the d.c. armature current $I_{bc}$ does not vary with time, no induction voltage emerges across the armature circuit, and only an constant resistance drop occurs due to resistance of the armature windings and armature current $I_{bc}$. Namely, an induction voltage caused by the changing representative value $I_{kq}$ and exist on the armature circuit during the period of time. Accordingly, the terminal voltage $V_{bc}$ of the armature rises sharply at the transition of the closing switch 6, and it falls sharply to the value of the resistance drop of the armature windings 3, 4 after the armature current $I_{bc}$ has reached the constant value. After that, the voltage $V_{bc}$ falls to the value of the resistance drop at a moderate rate of the quadrature-axis damper electrical time constant.

FIG. 4 shows the result of simulation for the terminal voltage $V_{bc}$ shown in FIG. 3 which is fed through the saturation circuit 10 so that the transitional voltage component which emerges until the armature current $I_{bc}$ settles to the steady state is eliminated. The waveform of the terminal voltage $V_{bc}$ of the armature is a series of plots on a fine voltage scale of the voltage after it has fallen nearly to the value of the resistance drop of the armature windings 3, 4. The actual waveform is recorded with the electromagnetic oscilloscope 14 and used for the analysis of the quadrature-axis damper electrical time constant. FIG. 5 shows a waveform recorded actually based on the present invention.

The waveform recorded by the electromagnetic oscilloscope 14 diminishes to a resistance drop of the armature windings 3, 4 the recorded waveform from which the resistance drop of the armature windings 3, 4 is subtracted is approximated to an exponential function to determine the time length until it decreases to a $1/e$ ($e = 2.72$), i.e., 37%, level, and the resulting time length is the electrical time constant of the quadrature-axis damper. The quadrature-axis damper time constant is set to the controller which is manufactured separately before it is shipped, and accordingly the conventional adjustment step carried out by combining the controller and motor can be eliminated.

Although in the foregoing embodiment the d.c. voltage $V_{bc}$ is applied to the armature windings through the resistor 7 by closing the switch 6, an alternative scheme is to maintain the application of the d.c. voltage $V_{bc}$ and open a switch 6A provided in a shunt circuit. This manner allows the switch 6A to be free from high voltage application, and thus facilitates the test.

Although in the foregoing embodiment the d.c. voltage $V_{bc}$ is applied to the armature windings through the resistor 7 by closing the switch 6, an alternative scheme is to have a steady state armature Current $I_{bc}$ by application of the d.c. voltage $V_{bc}$, and then open the switch 6. This manner, which corresponds to the principle of test mentioned previously, may encounter the emergence of an unpredictable transitional voltage when the switch 6 is opened, but the test can be conducted without the resistor 7.

According to the present invention, as described above, a synchronous machine is placed to have its rotor made stationary at the position where a quadrature-axis magnetomotive force is generated by the current conduction between armature windings of two phases, with a winding of remaining phase being opened, and the time length after the current having an approximate step waveform conducted to the two windings has reached a certain value until a voltage waveform which decreases to a value of the resistance drop of the armature windings falls to a certain level is measured with a measuring means. Consequently, the electrical time constant of the quadrature-axis damper of a synchronous machine can be measured accurately so that the optimal parameter value can be set as one of machine parameters to the controller, whereby the variable speed operation based on the high accuracy vector control can be accomplished.

The invention enables stand-alone machine test, which is implemented when the machine has been assembled in the factory, to evaluate the quadrature-axis damper electrical time constant which is one of machine parameters. Consequently, a test step for adjustment implemented by combining the controller and machine can be eliminated, and the expenditure of time and cost which would be expended for the combinational adjustment can be reduced.

What is claimed is:

1. An apparatus for measuring the electrical time constant of the quadrature-axis damper of a synchronous machine comprising: a synchronous machine which is placed to have its rotor made stationary at a position where a quadrature-axis magnetomotive force is generated when a current flows between armature windings of two phases, with a winding of remaining phase being opened; a d.c. power source which supplies a current having an approximate step waveform to said armature windings of two phases; and measuring means for measuring the electrical time constant as a time length beginning when said current has reached a prescribed value and ending when a voltage waveform which decreases to a value of resistance drop of the armature windings falls to a prescribed level.

2. An apparatus for measuring the electrical time constant of the quadrature-axis damper of a synchronous machine, said synchronous machine having a rotor, a first phase winding, and a second phase winding, said apparatus comprising:
   means for applying a step voltage waveform across said first phase winding and said second phase winding when said rotor is at a position where a quadrature-axis magnetomotive force is generated by a resulting current flowing between said first phase winding and said second phase winding;
   means responsively connected to said first phase winding and said second phase winding for measuring the electrical time constant as a length of a time interval between a first time when a voltage across said first phase winding and said second phase winding reaches a first prescribed value and a second time when said voltage falls to a second prescribed value.

3. An apparatus as claimed in claim 2, wherein said synchronous machine has a third phase winding which remains open.

4. An apparatus as claimed in claim 2, wherein said first prescribed value is a value said voltage attains when said resulting current flowing between said first phase winding and said second phase winding initially reaches a prescribed constant value.

5. An apparatus as claimed in claim 2 wherein said second prescribed value is a prescribed fraction of a difference between said first prescribed value and a threshold value of voltage across said first and second phase windings.

6. An apparatus as claimed in claim 2 wherein said threshold value is a product of a steady-state current flowing through said first and second phase windings and an ohmic resistance of said phase windings.

7. An apparatus as claimed in claim 2 wherein said means for applying a step voltage waveform across said first phase winding and said second phase winding comprises a series combination of a dc voltage source, a switch, and a resistor.

8. An apparatus as claimed in claim 2 wherein said means for applying a step voltage waveform across said first phase winding and said second phase winding comprises a series combination of a dc voltage source and a resistor, in parallel with a switch.

9. An apparatus as claimed in claim 2, wherein said measuring means comprises an oscilloscope.

10. An apparatus as claimed in claim 2 further comprising a saturation circuit interposed between first and second phase windings and said measuring means.

11. An apparatus for measuring the electrical time constant of the quadrature-axis damper of a synchronous machine, said synchronous machine having a rotor, a first phase winding, and a second phase winding, said apparatus comprising:

means for applying a step voltage waveform across said first phase winding and said second phase winding when said rotor is at a position where a quadrature-axis magnetomotive force is generated by a resulting current flowing between said first phase winding and said second phase winding;

means responsively connected to said first phase winding and said second phase winding for measuring the electrical time constant as a length of a time interval between a first time when a voltage across said first phase winding and said second phase winding reaches a first prescribed value as said resulting current reaches a prescribed constant value and a second time when said voltage falls to a second prescribed value which is a prescribed fraction of a difference between said first prescribed value and a threshold value which is a product of a steady-state current flowing through said first and second phase windings and an ohmic resistance of said phase windings.

12. An apparatus as claimed in claim 11 wherein said means for applying a step voltage waveform across said first phase winding and said second phase winding comprises a series combination of a dc voltage source, a switch, and a resistor.

13. An apparatus as claimed in claim 11 wherein said means for applying a step voltage waveform across said first phase winding and said second phase winding comprises a series combination of a dc voltage source and a resistor, in parallel with a switch.

14. An apparatus as claimed in claim 11 further comprising a saturation circuit interposed between first and second phase windings and said measuring means.

15. A method of measuring the electrical time constant of the quadrature-axis damper of a synchronous machine, said synchronous machine having a rotor, a first phase winding, and a second phase winding, said apparatus comprising the steps of:

placing said rotor in a position at which a quadrature-axis magnetomotive force would be generated by current flowing between said first phase winding and said second phase winding;

applying a step voltage waveform across said first phase winding and said second phase winding;

measuring the electrical time constant as a length of a time interval between a first time when a voltage across said first phase winding and said second phase winding reaches a first prescribed value and a second time when said voltage falls to a second prescribed value.

16. A method as claimed in claim 15, wherein said synchronous machine also includes a stator and a field winding, and wherein said placing step comprises the steps of:

short-circuiting said first and second phase windings;

applying a dc current to said first and second phase windings;

applying a dc current to said field winding;

positioning the rotor at a position of equilibrium between magnetic forces induced in the stator and the rotor.

17. A method as claimed in claim 15, wherein said first prescribed value is a value said voltage attains when said current flowing between said first phase winding and said second phase winding initially reaches a prescribed constant value.

18. A method as claimed in claim 15 wherein said second prescribed value is a prescribed fraction of a difference between said first prescribed value and a threshold value of voltage across said first and second phase windings.

19. A method as claimed in claim 18 wherein said threshold value is a product of a steady-state current flowing through said first and second phase windings and an ohmic resistance of said phase windings.

20. A method as claimed in claim 15 wherein said applying step comprises opening a switch that is located in a series combination with a dc voltage source for said first phase winding and said second phase winding, and a resistor.

* * * * *